(12) United States Patent
Kim et al.

(10) Patent No.: US 7,212,461 B2
(45) Date of Patent: May 1, 2007

(54) SEMICONDUCTOR MEMORY DEVICE

(75) Inventors: Jee-Yul Kim, Kyoungki-do (KR); Chang-Ho Do, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 85 days.

(21) Appl. No.: 11/193,145

(22) Filed: Jul. 27, 2005

(65) Prior Publication Data

US 2006/0221742 A1    Oct. 5, 2006

(30) Foreign Application Priority Data

Mar. 31, 2005    (KR) ...................... 10-2005-0027340

(51) Int. Cl.
*G11C 7/00*    (2006.01)
(52) U.S. Cl. .................. 365/222; 365/189.05; 365/233
(58) Field of Classification Search ........... 365/185.21, 365/189.05, 222, 230.08, 233; 326/62
See application file for complete search history.

(56) References Cited

U.S. PATENT DOCUMENTS 6,333,886 B2 * 12/2001 Cho et al. .................... 365/222
6,912,169 B2 *  6/2005 Choi ........................... 365/222
6,961,278 B2 * 11/2005 Jeong .......................... 365/222
6,990,032 B2 *  1/2006 Jang ............................ 365/222
6,990,033 B2 *  1/2006 Cho ............................. 365/222

* cited by examiner

*Primary Examiner*—Son Dinh
*Assistant Examiner*—Alexander Sofocleous
(74) *Attorney, Agent, or Firm*—Blakely Sokoloff Taylor & Zafman

(57) ABSTRACT

A memory device conducts a stable data access operation by removing glitch component in an internal clock outputted after a completion of self-refresh. This memory device includes a memory core region, a clock enable sensor for sensing an enable of a clock enable signal corresponding to a termination of a self-refresh operation to provide a sensing signal, a clock buffer for buffering a clock signal from the outside as an internal clock signal in response to the sensing signal and providing the internal clock signal to the memory core region, and a self-refresh control circuit for preventing a glitch component in the internal clock signal firstly outputted by the clock buffer in response to the sensing signal from transferring to the memory core region.

7 Claims, 5 Drawing Sheets

SEMICONDUCTOR MEMORY DEVICE

FIELD OF THE INVENTION

The present invention relates to a semiconductor memory device; and, more particularly, to a refresh operation of the semiconductor memory device.

DESCRIPTION OF RELATED ART

In DRAM most widely used among semiconductor memory devices, a unit cell is composed of a capacitor for storing data and a MOS transistor for conducting switch function.

The data in the capacitor is not maintained continuously but removed because electric charge is going to leak after a certain time in view of the capacitor's characteristics. To solve this defect, it needs to conduct a refresh operation that recharges the data store in the capacitor every constant time.

According to this necessity, DRAM performs the refresh operation on a predetermined time basis. In this operation, if signals such as address signals are not inputted from the outside due to an absence of data input and output, an address to be refreshed and a control signal to control refresh timing are created and refreshed internally. This is called self-refresh operation.

Meanwhile, during the self-refresh operation, no signals are provided from the outside because of a disable of clock enable signal and clock signal from the outside is also not delivered to the inside.

FIG. 1 shows a block configuration diagram representing a conventional semiconductor memory device.

Referring to FIG. 1, the conventional semiconductor memory device comprises a clock enable buffer 10 for inputting and buffering a clock enable signal CKE to output a self-refresh escape signal SREF, a self-refresh control circuit 20 for outputting a self-refresh operation signal buffer_enable in response to the self-refresh escape signal, and a clock buffer 30 for buffering and providing a clock signal CLK from the outside as an internal clock signal iclk in response to the self-refresh operation signal.

FIG. 2 presents a waveform diagram showing the operation of the memory device provided in FIG. 1. Hereinafter, the operation of the existing memory device and its problems will be explained with reference to FIGS. 1 and 2.

Specifically, the synchronous clock buffer 30 receives the clock signal CLK from the outside and outputs it as the internal clock signal; and then the memory device conducts all data access operation in synchronization with the internal clock signal.

Accordingly, unless the internal clock signal is applied to an internal core region of the memory device, it becomes a stand-by state, indicating that no operations are done.

The clock enable signal CKE is utilized to control the transfer of the internal clock signal to the internal core region of the memory device; and the clock buffer is operated to output the internal clock signal, only at an interval where the clock enable signal is inputted at an activation state.

In the meantime, a self-refresh interval is an interval at which the memory device internally conducts the refresh operation for the data access at the state of an absence of data input and output and address input. At this interval, it is not allowed to input other signals, but only the state of the clock enable signal is sensed.

If the self-refresh interval is passed, then the clock enable signal becomes activation state, and from that time on, the clock signal CLK is issued as the internal clock signal iclk, under the control of the self-refresh control circuit 20.

As shown in FIG. 2, if the clock enable signal CKE is enabled in high level, then the self-refresh escape signal SREF is activated in low level; and in response to this, the clock buffer 30 outputs the clock signal CLK from the outside as the internal clock signal iclk.

In this general memory device, however, the clock enable signal CKE and the self-refresh escape signal SREF are not signals that are created in synchronization with the clock signal CLK provided from the outside. Thus, under this state, if the clock buffer 30 outputs the clock signal from the outside as the internal clock signal since the self-refresh escape signal SREF has been activated, the internal clock signal does not have a constant period first, as shown in FIG. 2. This makes glitch component incurred therein.

Consequently, if the memory core region is operated through the use of the internal clock signal with such glitch component, there exist errors.

SUMMARY OF THE INVENTION

It is, therefore, a primary object of the present invention to provide a memory device that is capable of conducting a stable data access operation by removing glitch component in an internal clock outputted after a completion of self-refresh.

In accordance with one aspect of the present invention, there is provided a semiconductor memory device comprising: a memory core region; a clock enable sensor for sensing an enable of a clock enable signal corresponding to a termination of a self-refresh operation to provide a sensing signal; a clock buffer for buffering a clock signal from the outside as an internal clock signal in response to the sensing signal and providing the internal clock signal to the memory core region; and a self-refresh control circuit for preventing a glitch component in the internal clock signal firstly outputted by the clock buffer in response to the sensing signal from transferring to the memory core region.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, most preferred embodiments of the present invention will be described with reference to the accompanying drawings so that the invention could easily be conceived by a person skilled in the art to which the invention belongs.

Figure 1:
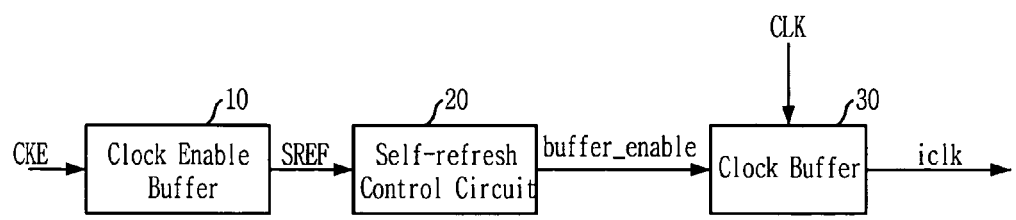
FIG. 1 is a block diagram showing a configuration of conventional semiconductor memory device.
Figure 2:
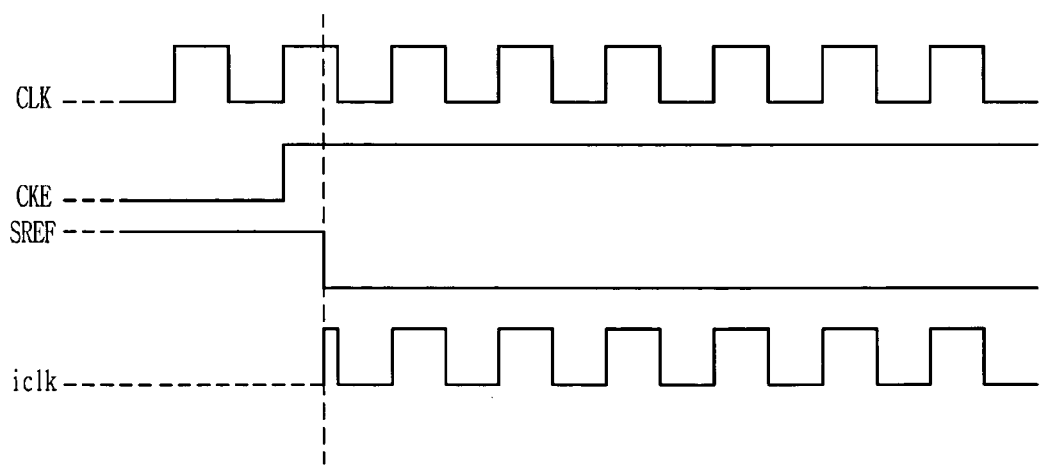
FIG. 2 is a waveform diagram representing the operation of the memory device shown in FIG. 1.
Figure 3:
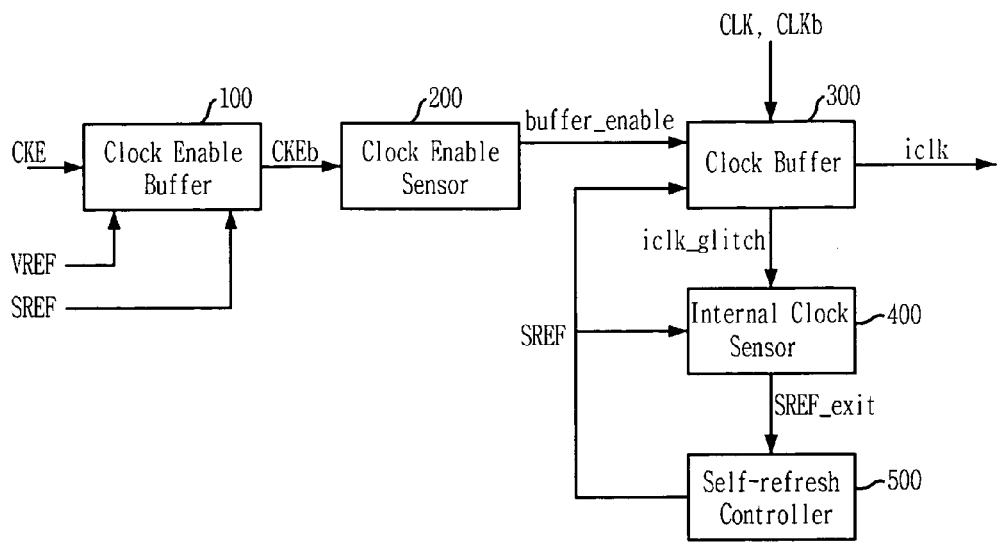
FIG. 3 a block diagram illustrating a semiconductor memory device in accordance with a preferred embodiment of the present invention.

FIG. 3 shows a block configuration diagram of a semiconductor memory device in accordance with a preferred embodiment of the present invention.

Referring to FIG. 3, the semiconductor memory device of the present invention comprises a memory core region (not shown), a clock enable sensor 200 for sensing an enabling of a clock enable signal CKE corresponding to a termination of a self-refresh operation to provide a sensing signal buffer_enable, a clock buffer 300 for buffering a clock signal CLK from the outside as an internal clock signal iclk and providing the internal clock signal to the memory core circuit in response to the sensing signal buffer_enable, and a self-refresh control circuit 400 and 500 for preventing a glitch component in the internal clock signal iclk_glitch firstly outputted by the clock buffer 300 in response to the sensing signal buffer_enable from transferring to the memory core circuit.

In the preferred embodiment of the invention, it is characterized that the self-refresh control circuit 400 and 500 controls the clock buffer 300 for outputting the clock signal CLK from the outside as the internal clock signal, and also provides a control signal SREF synchronized with the clock signal from the outside to the clock buffer 300.

To be more specific, the self-refresh control circuit 400 and 500 includes an internal clock sensor 400 for sensing a glitch component in the internal clock signal iclk_glitch firstly outputted by the clock buffer 300 in response to the sensing signal buffer_enable, and a self-refresh controller 500 for providing the clock buffer 300 with a self-refresh escape signal SREF that is the control signal to control the operation that the clock buffer 300 can output the clock to the memory core region, in response to the result SREF_exit sensed by the internal clock sensor 400.

Further, the memory device in accordance with the embodiment of the invention further comprises a clock enable buffer 100 for buffering the clock enable signal CKE and outputting it to the clock enable sensor 200.

Figure 4:
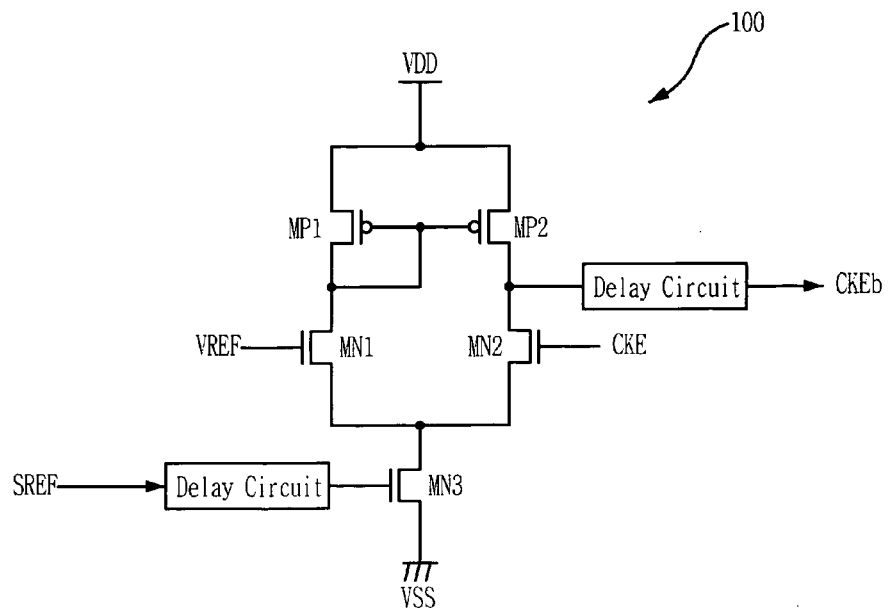
FIG. 4 is a detailed circuit diagram of the clock enable buffer shown in FIG. 3.

FIG. 4 illustrates a detailed circuit diagram of the clock enable buffer 100 depicted in FIG. 3.

As shown in FIG. 4, the clock enable buffer 100 includes a diode-type PMOS transistor MP1 whose one port is connected to a supply voltage VDD and the other port and the gate are coupled commonly, a PMOS transistor MP2 whose gate is commonly connected to the gate of the PMOS transistor MP1 to form a current mirror, an NMOS transistor MN1 whose gate inputs a reference signal VREF and one port is coupled with the other port of the PMOS transistor MP1, an NMOS transistor MN2 whose gate inputs the clock enable signal CKE and one port is coupled with the other port of the PMOS transistor MP2, and an NMOS transistor MN3 whose one port is commonly coupled with the other ports of the NMOS transistors MN1 and MN2, the other port is connected to the ground voltage vss, and the gate inputs a signal that is derived by delaying a self-refresh escape signal SREF inactivated in high level constantly, to make a current source. The details of the clock enable buffer 100 as configured above will be provided later.

Figure 5:
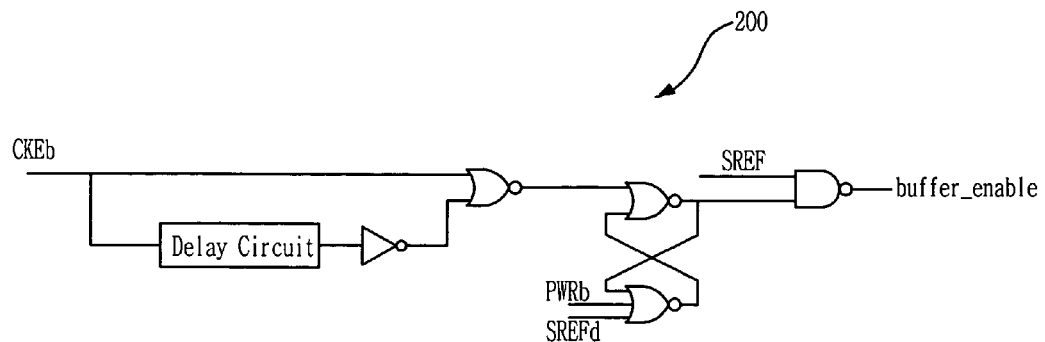
FIG. 5 is a detailed circuit diagram of the clock enable sensor depicted in FIG. 3.

FIG. 5 is a detailed circuit diagram of the clock enable sensor 200 shown in FIG. 3.

Referring to FIG. 5, the clock enable sensor 200 includes a delay circuit for delaying a clock enable signal CKEb from the clock enable buffer 100 for a preset time, a first NOR gate for inputting the output signal from the delay circuit and the clock enable signal CKEb and conducting a logical NOR operation on the signals, a second and a third NOR gates whose one ports receive the output from the first NOR gate and the delayed self-refresh escape signal SREFd, respectively, and their other ports are coupled with the outputs from the counterpart NOR gates in a cross couple manner, respectively, and a NAND gate for inputting the output from the NOR gate that does not receive the delayed self-refresh escape signal SREFd out of the two NOR gates and the self-refresh escape signal SREF and outputting the sensing signal buffer_enable.

Figure 6:
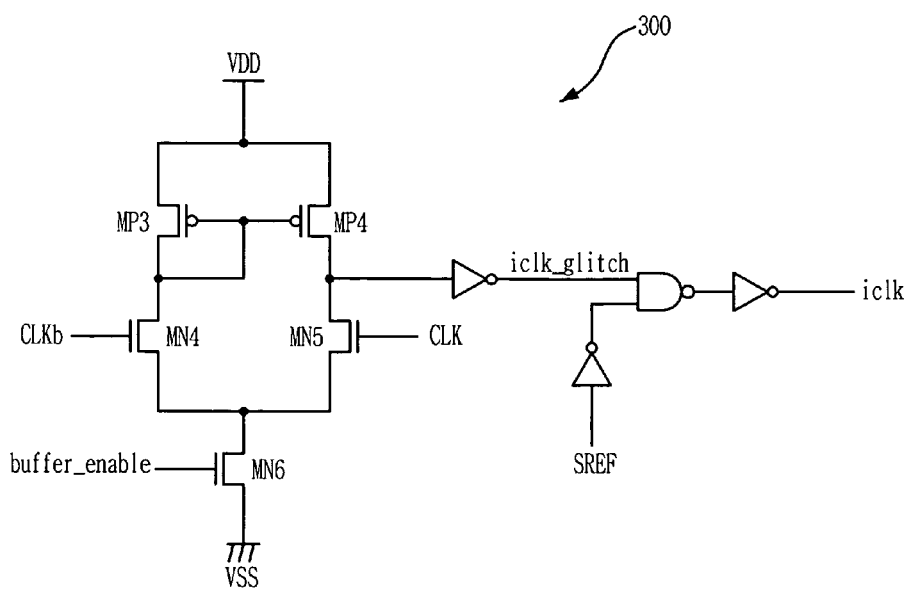
FIG. 6 is a detailed circuit diagram of the clock buffer shown in FIG. 3.

FIG. 6 provides a detailed circuit diagram illustrating the clock buffer 300 shown in FIG. 3.

Referring to FIG. 6, the clock buffer 300 includes a diode-type PMOS transistor MP3 whose one port is connected to a supply voltage VDD and the other port and the gate are coupled commonly, a PMOS transistor MP4 whose gate is commonly connected to the gate of the PMOS transistor MP3 to form a current mirror, an NMOS transistor MN4 whose gate inputs a clock signal CLKb and one port is coupled with the other port of the PMOS transistor MP3, an NMOS transistor MN5 whose gate inputs the clock signal CLK and one port is coupled with the other port of the PMOS transistor MP4, an NMOS transistor MN6 whose one port is commonly coupled with the other ports of the NMOS transistors MN4 and MN5, the other port is connected to the ground voltage VSS, and the gate inputs the signal buffer_enable that is obtained by the self-refresh escape signal SREF inactivated in high level by a certain time, to make a current source, an inverter for inverting a signal applied to one port of the NMOS transistor MN5 to output a preliminary clock signal iclk_glitch, and an AND gate for inputting the output from the inverter and the self-refresh escape signal SREF via another inverter and performing a logical AND operation on the signals to provide the internal clock signal iclk.

Meanwhile, a power up signal PWRb, which is not explained early, stands for a signal that is created by delaying a signal activated by means of sensing whether a stable power is supplied to the memory device.

Figure 7:
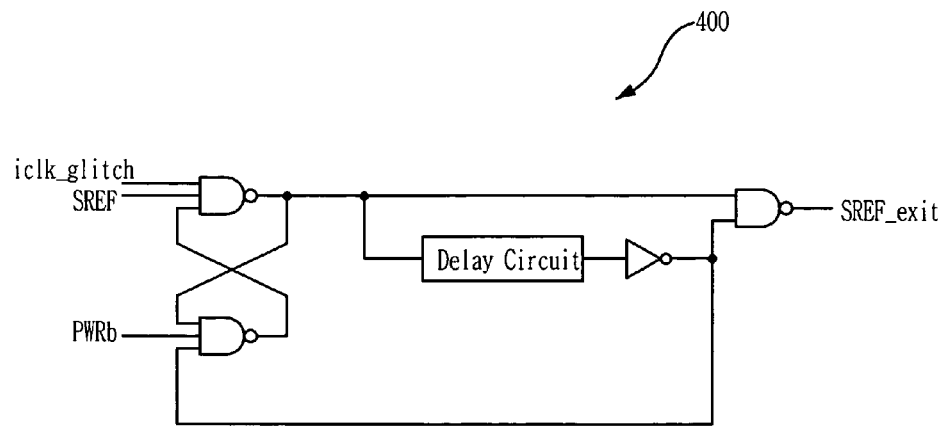
FIG. 7 is a detailed circuit diagram of the internal clock sensor in FIG. 3.

FIG. 7 shows a detailed circuit diagram of the internal clock sensor 400 in FIG. 3.

As shown in FIG. 7, the internal clock sensor 400 is composed of logic gates, in which when the preliminary clock signal iclk_glitch from the clock buffer 300 is inputted in the form of pulse, those gates sense the state and output the control signal SREF_exit with the form of pulse for notifying that the self-refresh has been completed.

Also, the power up signal PWRb as stated in FIG. 7 indicates a signal activated by sensing whether a stable power has been supplied to the memory device.

Figure 8:
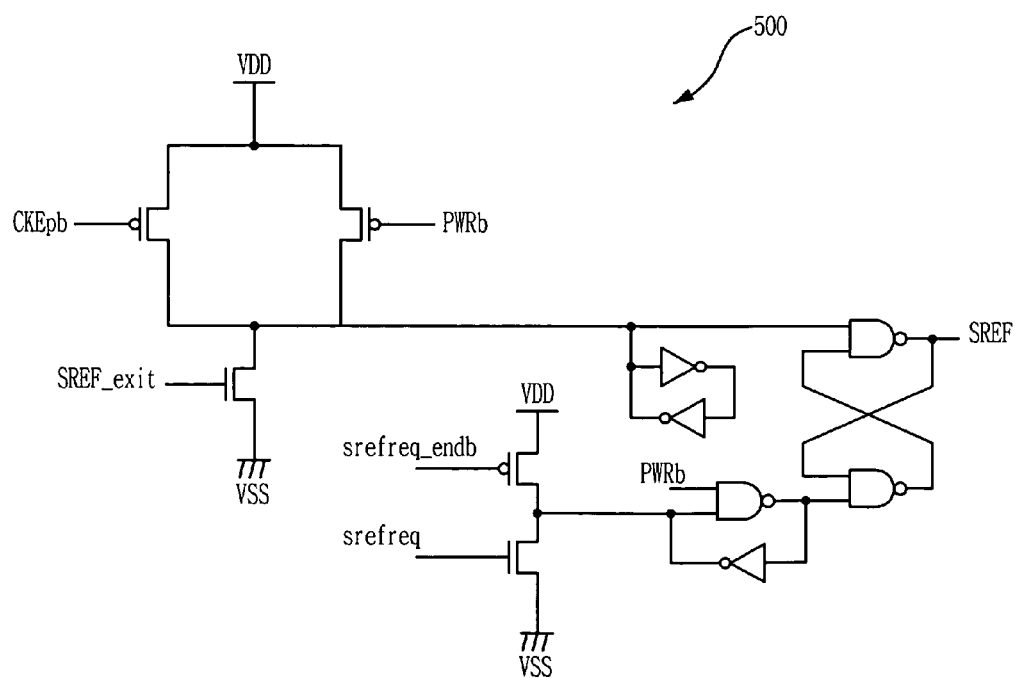
FIG. 8 is a detailed circuit diagram of the self-refresh controller shown in FIG. 3.

FIG. 8 offers a detailed circuit diagram of the self-refresh controller 500 depicted in FIG. 3.

Referring to FIG. 8, the self-refresh controller 500 is comprised of logic gates, which are activated by the control signal SREF_exit and the power up signal PWRb inputted in the form of pulse to inform that the self-refresh has been completed, and activate and output the self-refresh escape signal SREF in low level in response to a clock enable signal CKEpb of the pulse form. Herein, the clock enable signal CKEpb with the pulse form stands for a signal that is formed by delaying the clock enable signal CKE and then readjusted in the form of pulse.

Figure 9:
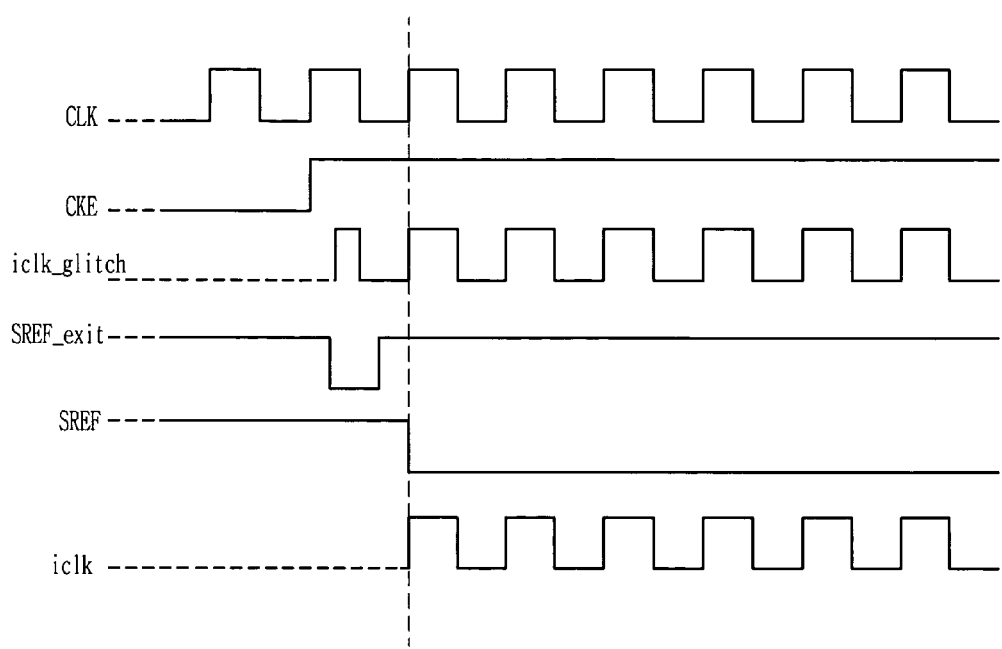
FIG. 9 is a waveform diagram showing the operation of the semiconductor memory device of the present invention depicted in FIGS. 3 to 8.

FIG. 9 shows a waveform diagram representing the operation of the semiconductor memory device of the present invention depicted in FIGS. 3 to 8. Hereinafter, the operation of the semiconductor memory device in accordance with the preferred embodiment of the invention will be described in detail with reference to FIGS. 3 to 9.

First of all, the clock enable buffer 100 delays the clock enable signal CKE and provides the delayed clock enable signal CKEb, at the state where it is activated by the self-refresh escape signal SREF inputting at inactivation state in high level. The clock enable signal CKE is maintained at the inactivation state of low level and then activated in high level to control the completion of the self-refresh. It is then provided to the clock enable buffer 100.

The clock enable sensor 200 outputs the sensing signal buffer_enable corresponding to the delayed clock enable signal CKEb.

The clock buffer 300 buffers and outputs the clock signals CLK and CLKb from the outside in response to the sensing signal buffer_enable, in which they are first outputted to the internal clock sensor 400 as the preliminary clock signal iclk_glitch, not as the internal clock.

Herein, at the state where the self-refresh escape signal SREF is inactivated in high level, the clock buffer 300 is operated in such a way that the internal clock is not outputted though the sensing signal buffer_enable is inputted.

The internal clock sensor 400 outputs the control signal SREF_exit with low level pulse in response to the preliminary clock signal iclk_glitch.

Next, the self-refresh controller 500 combines the control signal SREF_exit, the power up signal PWRb and the clock enable signal, to thereby provide the self-refresh escape signal SREF activated in low level.

The clock buffer 300 receives the self-refresh escape signal SREF activated in low level and then continues to output the internal clock signal iclk.

From the above, it can be seen that the self-refresh escape signal SREF means the escape of the self-refresh operation, whereas it is synchronized with the clock signal CLK.

Likewise the prior art, the clock buffer 300 does not output the internal clock as soon as the clock enable signal is activated; and but, it first outputs the preliminary clock signal as such upon the activation of the clock enable signal and then outputs, after synchronizing the self-refresh clock signal with the internal clock using the preliminary clock signal, the internal clock using this signal. By doing so, it is possible to prevent incorrect internal clock from outputting to the memory core region.

Even though the memory device is operated immediately after an escape of the self-refresh operation interval, it is operated using the stable internal clock, thus decreasing errors that create upon the escape of the self-refresh operation interval.

In other words, since the memory device of the present invention is operated in synchronization with the stable internal clock even when escaping the self-refresh operation interval, the operative error can be reduced largely at the initial time of escaping the self-refresh operation interval.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a memory core region;
   a clock enable sensor for sensing an enable of a clock enable signal corresponding to a termination of a self-refresh operation to provide a sensing signal;
   a clock buffer for buffering a clock signal from the outside as an internal clock signal in response to the sensing signal to thereby provide the internal clock signal to the memory core region; and
   a self-refresh control circuit for preventing a glitch component in the internal clock signal firstly outputted by the clock buffer in response to the sensing signal from transferring to the memory core region.

2. The semiconductor memory device as recited in claim 1, wherein the self-refresh control circuit controls the clock buffer for outputting the clock signal from the outside as the internal clock signal, and also outputs a control signal synchronized with the clock signal from the outside to the clock buffer.

3. The semiconductor memory device as recited in claim 1, wherein the self-refresh control circuit includes:
   an internal clock sensor for sensing the glitch component in the internal clock signal firstly outputted by the clock buffer in response to the sensing signal; and
   a self-refresh controller for providing the clock buffer with a self-refresh escape signal that is a control signal to control the operation that the clock buffer outputs a clock to the memory core region in response to the sensed result by the internal clock sensor.

4. The semiconductor memory device as recited in claim 3, further comprising a clock enable buffer for buffering the clock enable signal and outputting the buffered clock enable signal to the clock enable sensor.

5. The semiconductor memory device as recited in claim 4, wherein the clock enable buffer includes:
   a diode-type first PMOS transistor whose one port is connected to a supply voltage and the other port and the gate are coupled commonly;
   a second PMOS transistor whose gate is commonly connected to the gate of the first PMOS transistor to make a current mirror;
   a first NMOS transistor whose gate inputs a reference signal and one port is coupled with the other port of the first PMOS transistor;
   a second NMOS transistor whose gate inputs the clock enable signal and one port is coupled with the other port of the second PMOS transistor; and
   a third NMOS transistor whose one port is commonly coupled with the other ports of the first and the second NMOS transistors, the other port is connected to the ground voltage, and the gate inputs an inactivated self-refresh escape signal, to make a current source.

6. The semiconductor memory device as recited in claim 4, wherein the clock enable sensor includes:
   a delay circuit for delaying the clock enable signal from the clock enable buffer for a preset time;
   a first NOR gate for inputting the output signal from the delay circuit and the clock enable signal and conducting a logical NOR operation on the signals;
   a second and a third NOR gates whose one ports receive the output from the first NOR gate and the delayed self-refresh escape signal, respectively, and the other ports are coupled with the outputs from the counterpart NOR gates in a cross couple manner, respectively; and
   a NAND gate for inputting the output from the second NOR gate and the self-refresh escape signal and outputting the sensing signal.

7. The semiconductor memory device as recited in claim 6, wherein the clock buffer includes:
   a diode-type first PMOS transistor whose one port is connected to a supply voltage, and the other port and the gate are coupled commonly;

a second PMOS transistor whose gate is commonly connected to the gate of the first PMOS transistor to make a current mirror;

a first NMOS transistor whose gate inputs a clock signal and one port is coupled with the other port of the first PMOS transistor;

a second NMOS transistor whose gate inputs the inverted clock signal and one port is coupled with the other port of the second PMOS transistor;

a third NMOS transistor whose one port is commonly coupled with the other ports of the first and the second NMOS transistors, the other port is connected to the ground voltage, and the gate inputs the delayed sensing signal, to make a current source;

an inverter for inverting a signal applied to one port of the second NMOS transistor to output a preliminary clock signal; and an AND gate for inputting the preliminary clock signal and the self-refresh escape signal and performing a logical AND operation on the signals to provide the internal clock signal.

* * * * *